United States Patent
Fujita et al.

(10) Patent No.: US 10,090,341 B2
(45) Date of Patent: Oct. 2, 2018

(54) SOLID-STATE IMAGING DEVICE

(71) Applicant: HAMAMATSU PHOTONICS K.K., Hamamatsu-shi, Shizuoka (JP)

(72) Inventors: Kazuki Fujita, Hamamatsu (JP); Ryuji Kyushima, Hamamatsu (JP); Harumichi Mori, Hamamatsu (JP)

(73) Assignee: HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 84 days.

(21) Appl. No.: 14/897,144

(22) PCT Filed: May 29, 2014

(86) PCT No.: PCT/JP2014/064319
§ 371 (c)(1),
(2) Date: Dec. 9, 2015

(87) PCT Pub. No.: WO2014/199838
PCT Pub. Date: Dec. 18, 2014

(65) Prior Publication Data
US 2016/0126269 A1 May 5, 2016

(30) Foreign Application Priority Data
Jun. 11, 2013 (JP) ................................. 2013-122910

(51) Int. Cl.
*H01L 27/00* (2006.01)
*H01L 27/146* (2006.01)
(Continued)

(52) U.S. Cl.
CPC .. *H01L 27/14603* (2013.01); *H01L 27/14609* (2013.01); *H01L 27/14663* (2013.01); *H04N 5/32* (2013.01); *H04N 5/359* (2013.01)

(58) Field of Classification Search
CPC ......... H01L 27/14603; H01L 27/14609; H01L 27/14623; H04N 5/359; H04N 5/3742
See application file for complete search history.

(56) References Cited

U.S. PATENT DOCUMENTS

| 2008/0218608 A1 | 9/2008 | Rossi et al. |
| 2010/0193692 A1* | 8/2010 | Mori ........................ G01T 1/00 250/366 |
| 2011/0032391 A1 | 2/2011 | Cheung |

FOREIGN PATENT DOCUMENTS

| CN | 101809462 | 8/2010 |
| CN | 103037177 | 4/2013 |

(Continued)

OTHER PUBLICATIONS

International Preliminary Report on Patentability dated Dec. 23, 2015 for PCT/JP2014/064319.

*Primary Examiner* — Thanh Luu
(74) *Attorney, Agent, or Firm* — Drinker Biddle & Reath LLP (57) ABSTRACT

A solid-state imaging device comprises a photodetecting section, an unnecessary carrier capture section, and a vertical shift register. The unnecessary carrier capture section has carrier capture regions arranged in a region between the photodetecting section and the vertical shift register for respective rows. Each of the carrier capture regions includes a transistor and a photodiode. The transistor has one terminal connected to the photodiode and the other terminal connected to a charge elimination line. The charge elimination line is short-circuited to a reference potential line.

14 Claims, 9 Drawing Sheets

(51) Int. Cl.
*H04N 5/32* (2006.01)
*H04N 5/359* (2011.01)

(56) References Cited

FOREIGN PATENT DOCUMENTS

| EP | 1 067 606 | 1/2001 |
| EP | 1 378 942 | 1/2004 |
| EP | 2 199 829 | 6/2010 |
| JP | 2000-101058 | 4/2000 |
| JP | 2005-057281 | 3/2005 |
| JP | 2006-073621 | 3/2006 |
| JP | 2007-050053 A | 3/2007 |
| JP | 2007-324248 | 12/2007 |
| JP | 2009-079923 | 4/2009 |
| TW | 201226864 | 7/2012 |
| TW | 201316214 | 4/2013 |
| WO | WO 2009/011465 | 1/2009 |

* cited by examiner

SOLID-STATE IMAGING DEVICE

TECHNICAL FIELD

The present invention relates to a solid-state imaging device.

BACKGROUND ART

Patent Literature 1 describes a technique concerning a radiation imaging device. The device comprises a sensor array constructed by two-dimensionally arraying a plurality of pixels each including a conversion element for converting a radiation from an object into an electric signal and a transfer switch for transferring the electric signal to the outside. The device also comprises a plurality of gate lines connecting the pixels of the sensor array in the row direction, a gate drive device for driving the gate lines in order to read out the electric signals of the pixels connected to each gate line, a plurality of signal lines for connecting the pixels of the sensor array in the column direction, and a plurality of amplifiers, provided so as to correspond to the respective signal lines, for amplifying and reading out the electric signals transferred from the respective transfer switches.

CITATION LIST

Patent Literature

Patent Literature 1: Japanese Patent Application Laid-Open No. 2007-50053

SUMMARY OF INVENTION

Technical Problem

A solid-state imaging device has a photodetecting section in which a plurality of pixels are arrayed two-dimensionally over a plurality of rows and a plurality of columns. A photodiode for converting light incident thereon into an electron is arranged in each pixel. The photodiodes of the pixels are connected through switch circuits (e.g., transistors) to a readout line provided for each column, while the charges accumulated within the photodiode flow out to the readout line when the switch circuit is turned on. The charges reach an integration circuit through the readout line and are converted into a voltage signal in the integration circuit. A control terminal (e.g., gate terminal) for controlling the conduction state of the switch circuit in each pixel is connected to a row selection line provided for each row. A signal from a shift register is supplied to the control terminal of each switch circuit through the row selection line, whereby the charges are read out from the pixels for each row.

In the solid-state imaging device having such a configuration, light is incident on not only the photodetecting section but its surrounding regions as well. When the regions surrounding the photodetecting section are covered with a scintillator in the case where the solid-state imaging device is used as an X-ray imaging device, for example, X-rays transmitted through the scintillator and scintillation light from the scintillator are incident on the regions surrounding the photodetecting section. This generates unnecessary charges (carriers) in the regions surrounding the photodetecting section. Since the shift register juxtaposed with the photodetecting section has a substantial area, a large number of unnecessary carriers occur in the region formed with the shift register in particular.

When unnecessary carriers generated in the shift register flow into the photodetecting section, noise is superimposed on outputs from pixels adjacent to the shift register. For avoiding such a phenomenon, a photodiode (dummy photodiode) for absorbing unnecessary carriers may be arranged in a region between the shift register and photodetecting section and short-circuited to a reference potential line (grounding line).

However, the following problem exists in this scheme. Typically, between pixels adjacent to each other in the photodetecting section, crosstalk exists because of coupling capacitance occurring between their photodiodes and the like. In each pixel, parasitic capacitance also exists between the photodiode and row selection line connected to each other through the switch circuit and also affects the crosstalk. However, the above-described dummy photodiode is provided with no switch circuit and thus does not generate such parasitic capacitance. Therefore, pixels adjacent to the dummy photodiode have different degrees of crosstalk as compared with other pixels, whereby output characteristics and magnitudes of noise from pixels adjacent to the dummy photodiode differ from those of the other pixels.

In view of the above problem, it is an object of the present invention to provide a solid-state imaging device which enables pixels adjacent to a dummy photodiode to have output characteristics and magnitudes of noise closer to those of the other pixels.

Solution to Problem

In order to solve the above-described problem, the solid-state imaging device in accordance with the present invention comprises a photodetecting section having M×N pixels (each of M and N being an integer of 2 or more), each including a first photodiode and a first switch circuit having one terminal connected to the first photodiode, two-dimensionally arrayed in M rows and N columns; N readout lines provided for the respective columns and connected to the other terminals of the first switch circuits included in the pixels of the corresponding columns; a readout circuit section connected to the N readout lines; a shift register, juxtaposed with the photodetecting section in a row direction, for controlling an open/closed state of the first switch circuits for each row; M dummy photodiodes arranged in a region between the shift register and the photodetecting section for the respective rows; M second switch circuits having respective one terminals connected to the M dummy photodiodes; and a charge elimination line connected to the other terminals of the M second switch circuits and short-circuited to a reference potential line.

In this solid-state imaging device, M dummy photodiodes are arranged for the respective rows in a region between a shift register and a photodetecting section. Unnecessary carriers occurring in the shift register are absorbed by the dummy photodiodes. This can effectively prevent noise caused by unnecessary carriers generated in the shift register from being superimposed on outputs from pixels in the photodetecting section.

In the solid-state imaging device, the dummy photodiode and a charge elimination line are connected to each other through a second switch circuit, and when the second switch circuit is turned on, unnecessary carriers are discharged from the dummy photodiode to a reference potential line through the charge elimination line. Thus, in the above-described solid-state imaging device, the dummy photodiode is provided with the second switch circuit as with the first switch circuit in each pixel in the photodetecting section. Therefore, the above solid-state imaging device enables pixels adjacent to the dummy photodiode to have crosstalk with a magnitude close to that of crosstalk in other pixels, thereby making it possible for pixels adjacent to the dummy photodiode to have output characteristics and magnitudes of noise closer to those of the other pixels.

Advantageous Effects of Invention

The solid-state imaging device in accordance with the present invention enables pixels adjacent to a dummy photodiode to have output characteristics and magnitudes of noise closer to those of the other pixels.

BRIEF DESCRIPTION OF DRAWINGS

FIG. 7 includes (a) a plan view of the photodetecting section illustrating an example of boundaries of joint exposure, and (b) a diagram illustrating an example of boundaries of joint exposure in the vicinity of a carrier capture section.

FIG. 8 includes (a) a plan view of the photodetecting section illustrating another example of boundaries of joint exposure, and (b) a diagram illustrating another example of boundaries of joint exposure in the vicinity of the carrier capture section.

DESCRIPTION OF EMBODIMENTS

An embodiment of the solid-state imaging device in accordance with the present invention will be described below in detail with reference to the accompanying drawings. In the explanation of the drawings, the same elements will be denoted by the same reference signs, while omitting their overlapping descriptions.

Figure 1:
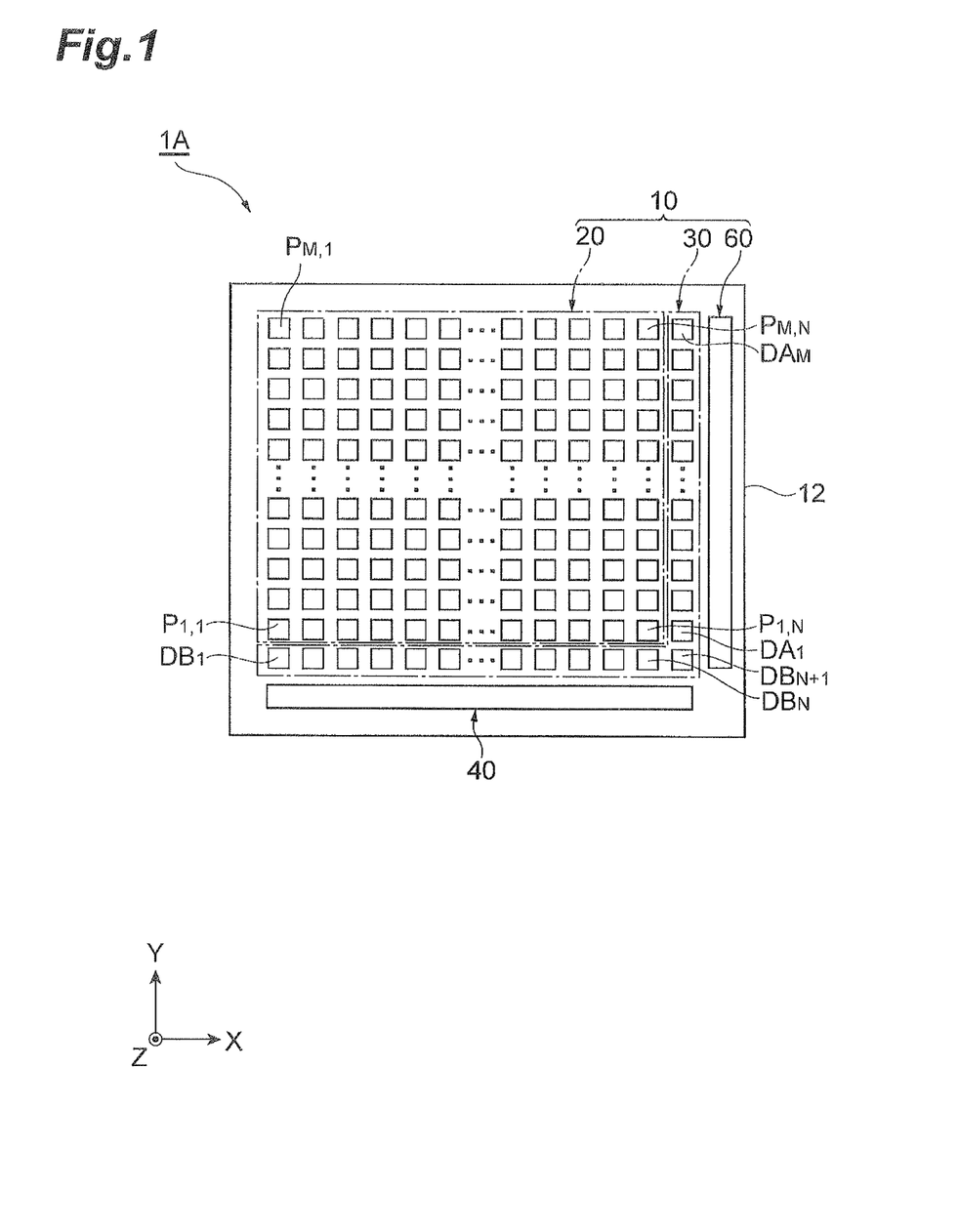
FIG. 1 is a plan view illustrating a solid-state imaging device.
Figure 2:
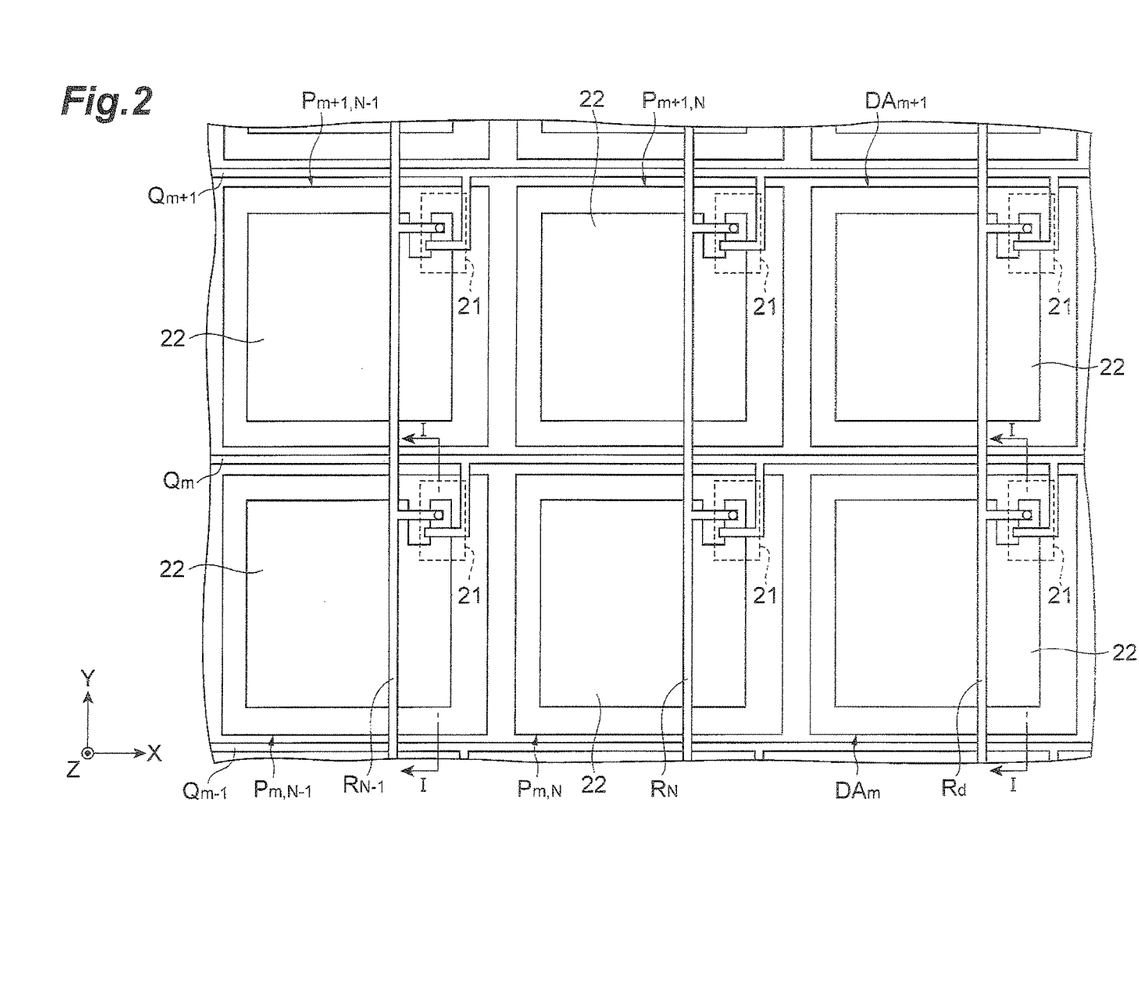
FIG. 2 is a plan view enlarging a part of the solid-state imaging device.

The solid-state imaging device in accordance with an embodiment is used for a medical X-ray imaging system, for example. FIG. 1 and FIG. 2 are diagrams illustrating a configuration of a solid-state imaging device 1A in this embodiment. FIG. 1 is a plan view illustrating the solid-state imaging device 1A, while FIG. 2 is a plan view enlarging a part of the solid-state imaging device 1A. FIG. 1 and FIG. 2 also depict an XYZ orthogonal coordinate system for easier understanding.

As illustrated in FIG. 1, the solid-state imaging device 1A comprises a photodetecting section 20, an unnecessary carrier capture section 30, a readout circuit section 40, and a vertical shift register 60. The photodetecting section 20, unnecessary carrier capture section 30, readout circuit section 40, and vertical shift register 60 are formed on a principal surface of a substrate 12. The vertical shift register 60 is juxtaposed with the photodetecting section 20 in the X-axis direction. A part of the unnecessary carrier capture section 30 is arranged in a region between the photodetecting section 20 and the vertical shift register 60, while the remaining part of the unnecessary carrier capture section 30 is juxtaposed with the photodetecting section 20 in the Y-axis direction and located in a region between the photodetecting section 20 and readout circuit section 40.

The readout circuit section 40 includes a plurality of integration circuits provided so as to correspond to respective columns of the photodetecting section 20, while the integration circuits respectively generate voltage values corresponding to amounts of charges output from the pixels in the corresponding columns. The readout circuit section 40 holds the voltage values output from the respective integration circuits and successively outputs the held voltage values.

The photodetecting section 20 is constructed by two-dimensionally arranging a plurality of pixels $P_{1,1}$ to $P_{M,N}$ over M rows and N columns (where each of M and N is an integer of 2 or more). FIG. 2 depicts four pixels $P_{m,N-1}$, $P_{m,N}$, $P_{m+1,N-1}$, $P_{m+1,N}$ as representative of the plurality of pixels $P_{1,1}$ to $P_{M,N}$. For example, the pixel $P_{m,N}$ is the one located on the m-th row and the N-th column (where m is an integer of 1 or more and M or less). In FIG. 1 and FIG. 2, the column direction coincides with the Y-axis direction, and the row direction coincides with the X-axis direction.

Each of the pixels $P_{1,1}$ to $P_{M,N}$ included in the photodetecting section 20 comprises a transistor 21 and a photodiode 22. Each of the transistors 21 in the pixels $P_{1,1}$ to $P_{M,N}$ is a first switch circuit in this embodiment. The transistor 21 is preferably constituted by a field-effect transistor (FET) but may also be constituted by a bipolar transistor. The following explanation will assume the transistor 21 to be an FET. In this case, by control terminal is meant a gate. When the transistor 21 is a bipolar transistor, by control terminal is meant a base.

Each of the photodiodes 22 in the pixels $P_{1,1}$ to $P_{M,N}$ is a first photodiode in this embodiment. The photodiode 22, which is constituted by a semiconductor region including a p-n junction or p-i-n junction, generates charges by an amount corresponding to the intensity of light incident thereon and accumulates thus generated charges in a junction capacitance part. The transistor 21 has one terminal (e.g., a source region) electrically connected to the photodiode 22. An undepicted scintillator is disposed on the photodetecting section 20. The scintillator generates scintillation light according to X-rays incident thereon, converts an X-ray image into a light image, and outputs the light image to the photodiodes 22.

The solid-state imaging device 1A further comprises a plurality of row selection lines $Q_1$ to $Q_M$ (represented by $Q_m$ and $Q_{m+1}$ in FIG. 2) provided for the respective rows and a plurality of readout lines $R_1$ to $R_N$ (represented by $R_N$ and $R_{N-1}$ in FIG. 2) provided for the respective columns.

The row selection line $Q_m$ of the m-th row electrically connects the control terminals (e.g., gate terminals) for controlling the open/closed state of the transistors 21 included in the pixels $P_{m,1}$ to $P_{m,N}$ of the corresponding row and the vertical shift register 60 for controlling the open/closed state of the transistors 21 for each row to each other. The readout line $R_n$ of the n-th column (where n is an integer of 1 or more and N or less) is electrically connected to the other terminals (e.g., drain regions) of the transistors 21 included in the pixels $P_{1,n}$ to $P_{M,n}$ of the corresponding column. The plurality of row selection lines $Q_1$ to $Q_M$ and plurality of readout lines $R_1$ to $R_N$ are made of a metal, for example.

The unnecessary carrier capture section 30 has M carrier capture regions $DA_1$ to $DA_M$. The carrier capture regions $DA_1$ to $DA_M$ are arranged in a region between the photodetecting section 20 and vertical shift register 60 for the respective rows. FIG. 2 illustrates two carrier capture regions $DA_m$, $DA_{m+1}$ as representative of the carrier capture regions $DA_1$ to $DA_M$. For example, the carrier capture region $DA_m$ is the carrier capture region located at the m-th row. As with the above-described pixels $P_{1,1}$ to $P_{M,N}$, each of the M carrier capture regions $DA_1$ to $DA_M$ comprises a transistor 21 and a photodiode 22.

Each of the M transistors 21 in the carrier capture regions $DA_1$ to $DA_M$ is a second switch circuit in this embodiment. The M photodiodes 22 in the carrier capture regions $DA_1$ to $DA_M$, each of which is a dummy photodiode in this embodiment and constituted by a semiconductor region including a p-n junction or p-i-n junction, are arranged in a region between the photodetecting section 20 and vertical shift register 60 for the respective rows. The transistor 21 has one terminal (e.g., a source region) electrically connected to the photodiode 22.

A control terminal (e.g., gate terminal) for controlling the open/closed state of the transistor 21 included in the carrier capture region $DA_m$ is electrically connected to the row selection line $Q_m$ of the corresponding row. The solid-state imaging device 1A further comprises a charge elimination line $R_d$. The charge elimination line $R_d$ is electrically connected to the other terminals (e.g., drain regions) of the transistors 21 included in the carrier capture regions $DA_1$ to $DA_M$. The charge elimination line $R_d$ is made of a metal. Light is incident on the carrier capture regions $DA_1$ to $DA_M$, which are not light-shielded, as on the normal pixels $P_{1,1}$ to $P_{M,N}$. However, the carrier capture regions $DA_1$ to $DA_M$ may partly or wholly be light-shielded.

The unnecessary carrier capture section 30 further has (N+1) carrier capture regions $DB_1$ to $DB_{N+1}$ arranged for the respective columns. The carrier capture regions $DB_1$ to $DB_{N+1}$ are constructed as with the above-described pixels $P_{1,1}$ to $P_{M,N}$. That is, each of the carrier capture regions $DB_1$ to $DB_{N+1}$ comprises a transistor 21 and a photodiode 22.

The transistor 21 has one terminal (e.g., source region) electrically connected to the photodiode 22. Control terminals of the transistors 21 included in the carrier capture regions $DB_1$ to $DB_{N+1}$ are electrically connected to a row selection line $Q_d$ which will be explained later. The other terminals (e.g., drain regions) of the transistors 21 included in the carrier capture regions $DB_1$ to $DB_N$ are electrically connected to the readout lines $R_1$ to $R_N$ of the respective columns. The other terminal of the transistor 21 included in the carrier capture region $DB_{N+1}$ of the (N+1)-th column is electrically connected to the charge elimination line $R_d$.

Figure 3:
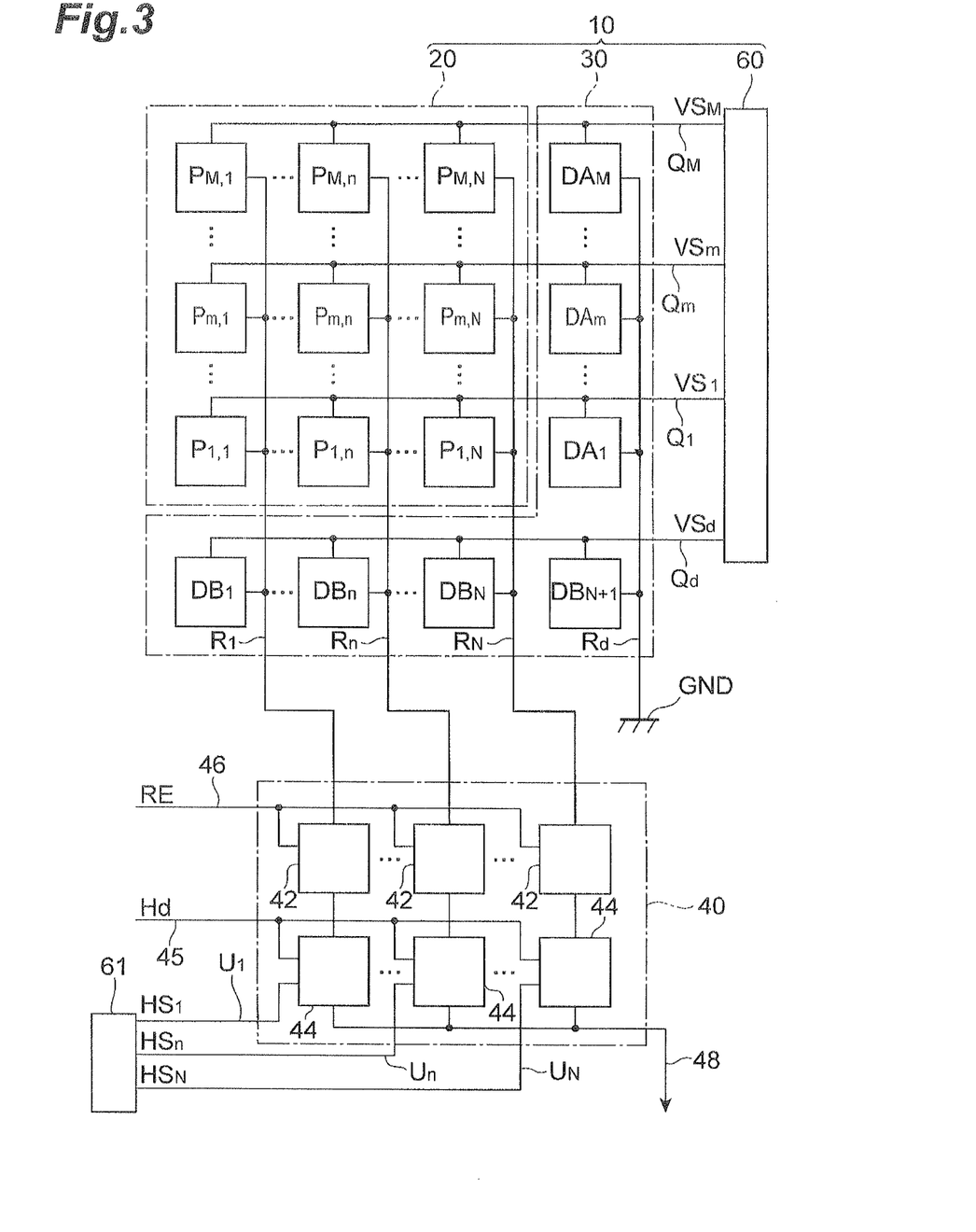
FIG. 3 is a diagram illustrating an inner configuration of the solid-state imaging device.

A circuit configuration of the solid-state imaging device 1A will now be explained in detail. FIG. 3 is a diagram illustrating an inner configuration of the solid-state imaging device 1A. As described above, the photodetecting section 20 is constructed by two-dimensionally arraying M×N pixels $P_{1,1}$ to $P_{M,N}$ in M rows and N columns. The unnecessary carrier capture section 30 includes the M carrier capture regions $DA_1$ to $DA_M$ and (N+1) carrier capture regions $DB_1$ to $DB_{N+1}$. The m-throw selection line $Q_m$ connected to the N pixels $P_{m,1}$ to $P_{m,N}$ and carrier capture region $DA_m$ of the m-th row is connected to the vertical shift register 60. The row selection line $Q_d$ connected to the carrier capture regions $DB_1$ to $DB_{N+1}$ is also connected to the vertical shift register 60.

The readout circuit section 40 is a circuit for successively outputting electric signals corresponding to amounts of charges output for the respective columns through the readout lines $R_1$ to $R_N$. The readout circuit section 40 has N integration circuits 42 provided for the respective columns and N holding circuits 44. The integration circuit 42 and holding circuit 44 are connected in series to each other for each column. The N integration circuits 42 have a configuration in common. The N holding circuits 44 have a configuration in common.

The N integration circuits 42 have respective input terminals connected to the readout lines $R_1$ to $R_N$, accumulate charges input from the readout lines $R_1$ to $R_N$, and output respective voltage values corresponding to the amounts of accumulated charges from output terminals to the N holding circuits 44. Here, the charge elimination line $R_d$ is provided with no integration circuit, but is short-circuited to a reference potential line (a potential line connected to the ground potential in this embodiment) GND. Therefore, the charges having passed through the charge elimination line $R_d$ is discharged to the reference potential line GND. Thus, unlike the signals output from the photodiodes 22 of the pixels $P_{1,1}$ to $P_{M,N}$ and input to the readout circuit section 40, the signals output from the respective dummy photodiodes 22 of the carrier capture regions $DA_1$ to $DA_M$ are not output from the solid-state imaging device 1A.

The N integration circuits 42 are respectively connected to a reset line 46 provided in common for the N integration circuits 42. The N holding circuits 44 have respective input terminals connected to the output terminals of the integration circuits 42, hold the voltage values input to the input terminals, and output the held voltage values from the output terminals to a voltage output line 48. The N holding circuits 44 are respectively connected to a hold line 45 provided in common for the N holding circuits 44. The N holding circuits 44 are also respectively connected to a horizontal shift register 61 through a first column selection line $U_1$ to an N-th column selection line $U_N$.

The vertical shift register 60 provides the N pixels $P_{m,1}$ to $P_{m,N}$ at the m-th row with an m-th row selection control signal $VS_m$ through the m-th row selection line $Q_m$. In addition, the vertical shift register 60 provides the (N+1) carrier capture regions $DB_1$ to $DB_{N+1}$ with a row selection control signal $VS_d$ through the row selection line $Q_d$. In the vertical shift register 60, the row selection control signals $VS_d$, $VS_1$ to $VS_M$ sequentially become significant values.

The horizontal shift register 61 provides the N holding circuits 44 with column selection control signals $HS_1$ to $HS_N$ through the column selection lines $U_1$ to $U_N$, respectively. The column selection control signals $HS_1$ to $HS_N$ sequentially become significant values. Each of the N integration circuits 42 is provided with a reset control signal RE through the reset line 46. Each of the N holding circuits 44 is provided with a hold control signal Hd through the hold line 45.

Figure 4:
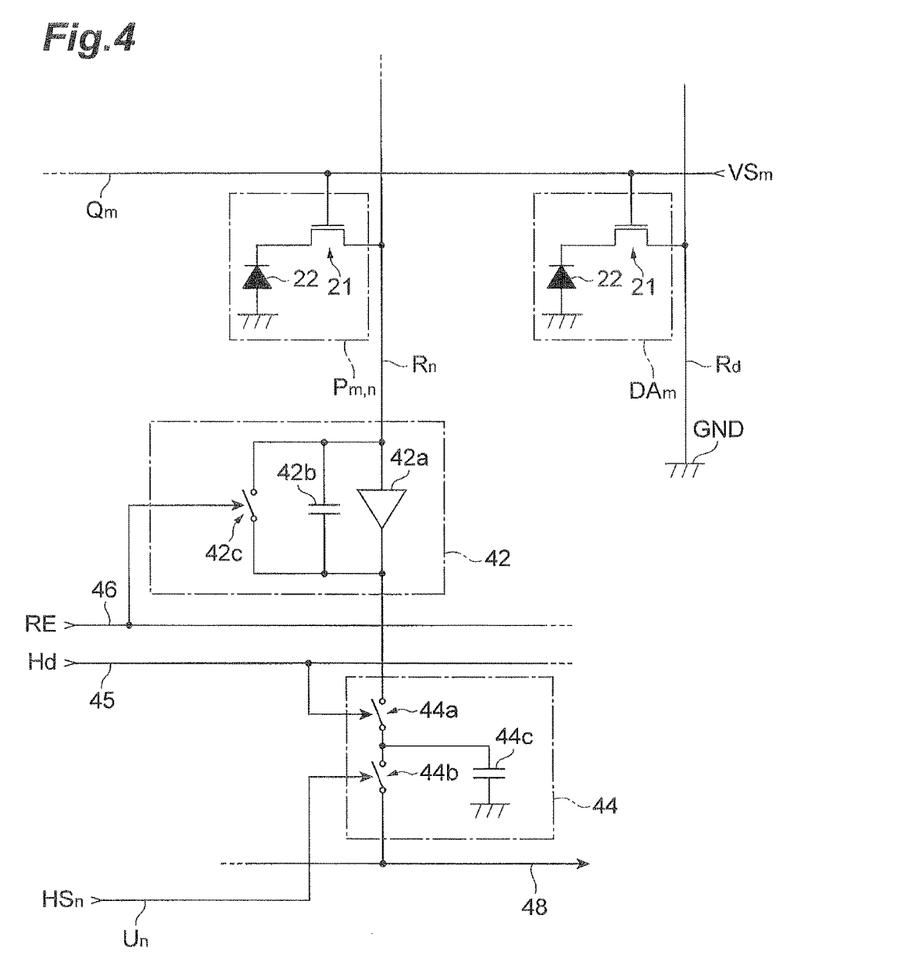
FIG. 4 is a diagram illustrating a detailed circuit configuration example of a pixel, an integration circuit, a holding circuit, and a carrier capture region.

FIG. 4 is a diagram illustrating a detailed circuit configuration example of the pixel $P_{m,n}$, integration circuit 42, holding circuit 44, and carrier capture region $DA_m$. Here, a circuit diagram of the pixel $P_{m,n}$ on the m-th row and the n-th column is illustrated as a representative of the M×N pixels $P_{1,1}$ to $P_{M,N}$, and a circuit diagram of the carrier capture region $DA_m$ at the m-th row is illustrated as a representative of the M carrier capture regions $DA_1$ to $DA_M$.

As illustrated in FIG. 4, the photodiode 22 of the pixel $P_{m,n}$ has a grounded anode terminal and a cathode terminal connected to the readout line $R_n$ through the transistor 21. Similarly, the photodiode 22 of the carrier capture region $DA_m$ has a grounded anode terminal and a cathode terminal connected to the charge elimination line $R_d$ through the transistor 21. The transistors 21 of the pixel $P_{m,n}$ and carrier capture region $DA_m$ are provided with the m-th row selection control signal $VS_m$ from the vertical shift register 60 through the m-th row selection line $Q_m$. The m-th row selection control signal $VS_m$ instructs the transistors 21 included in the N pixels $P_{m,1}$ to $P_{m,N}$ and carrier capture region $DA_m$ at the m-th row to open/close.

When the m-th row selection control signal $VS_m$ is a non-significant value (off-voltage of the control terminal of the transistor 21), for example, the transistor 21 is turned off. At this time, the charges generated in the photodiode 22 are accumulated in the junction capacitance part of the photodiode 22 without being output to the readout line $R_n$ (or the charge elimination line $R_d$). When the m-th row selection control signal $VS_m$ is a significant value (on-voltage of the control terminal of the transistor 21), on the other hand, the transistor 21 is turned on. At this time, the charges accumulated in the junction capacitance part of the photodiode 22 are output to the readout line $R_n$ (or charge elimination line $R_d$) through the transistor 21. The charges output from the photodiode 22 of the pixel $P_{m,n}$ are sent to the integration circuit 42 through the readout line $R_n$. On the other hand, the charges output from the photodiode 22 of the carrier capture region $DA_m$ are sent to the reference potential line GND through the charge elimination line $R_d$.

The integration circuit 42 has a so-called charge integration type configuration including an amplifier 42a, a capacitive element 42b, and a discharge switch 42c. The capacitive element 42b and discharge switch 42c are connected in parallel with each other between the input terminal and output terminal of the amplifier 42a. The amplifier 42a has an input terminal connected to the readout line $R_n$. The discharge switch 42c is provided with the reset control signal RE through the reset line 46.

The reset control signal RE instructs the respective discharge switches 42c of the N integration circuits 42 to open/close. For example, when the reset control signal RE is a non-significant value (e.g., high level), the discharge switch 42c closes, so as to discharge the capacitive element 42b, thereby initializing the output voltage value of the integration circuit 42. When the reset control signal RE is a significant value (e.g., low level), the discharge switch 42c opens, so that the charges input to the integration circuit 42 are accumulated in the capacitive element 42b, whereby a voltage value corresponding to the amount of accumulated charges is output from the integration circuit 42.

The holding circuit 44 includes an input switch 44a, an output switch 44b, and a capacitive element 44c. One end of the capacitive element 44c is grounded. The other end of the capacitive element 44c is connected to the output terminal of the integration circuit 42 through the input switch 44a and also connected to the voltage output line 48 through the output switch 44b. The input switch 44a is provided with the hold control signal Hd through the hold line 45. The hold control signal Hd instructs the respective input switches 44a of the N holding circuits 44 to open/close. The output switch 44b of the holding circuit 44 is provided with the n-th column selection control signal $HS_n$ through the n-th column selection line $U_n$. The selection control signal $HS_n$ instructs the output switch 44b of the holding circuit 44 to open/close.

When the hold control signal Hd changes from the high level to the low level, for example, the input switch 44a changes from the closed state to the open state, whereupon the voltage value input to the holding circuit 44 is held by the capacitive element 44c. When the n-th column selection control signal $HS_n$ changes from the low level to the high level, the output switch 44b is closed, whereupon the voltage value held by the capacitive element 44c is output to the voltage output line 48.

Figure 5:
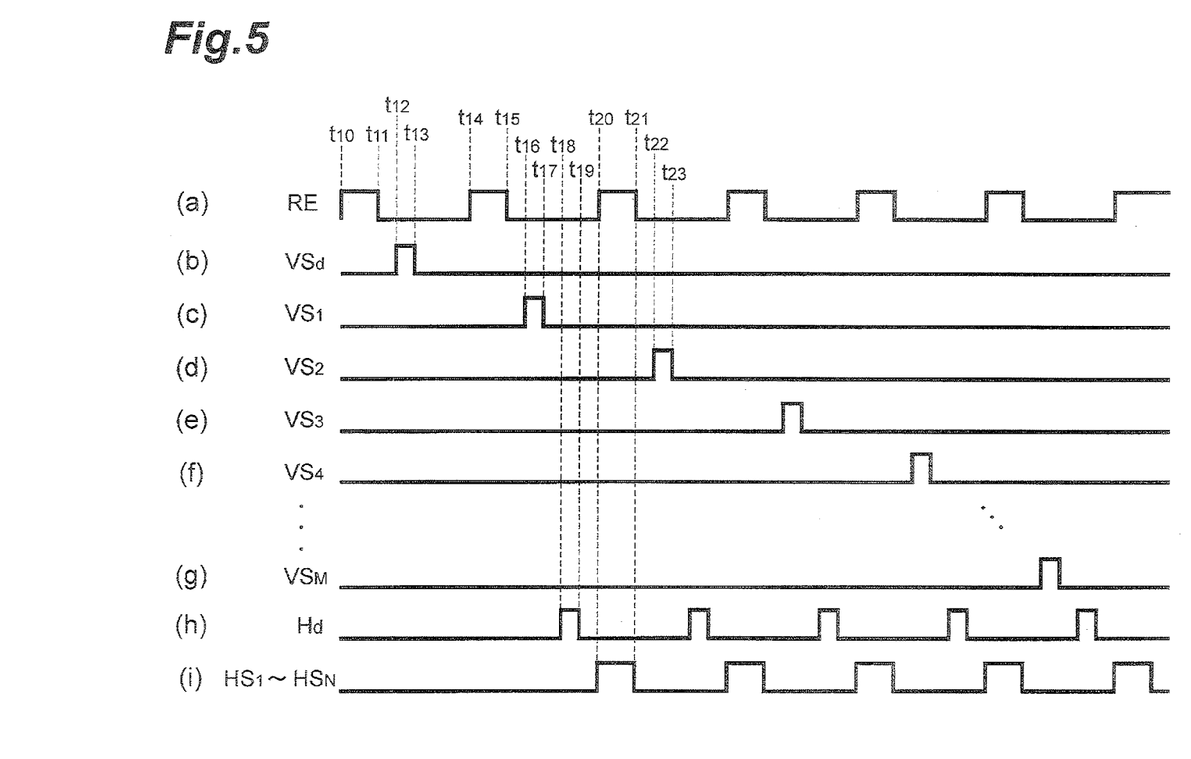
FIG. 5 is a timing chart of respective signals.

FIG. 5 is a timing chart of respective signals. FIG. 5 illustrates, successively from the upper side, (a) reset control signal RE, (b) row selection control signal $VS_d$, (c) first row selection control signal $VS_1$, (d) second row selection control signal $VS_2$, (e) third row selection control signal $VS_3$, (f) fourth row selection control signal $VS_4$, (g) M-th row selection control signal $VS_M$, (h) hold control signal Hd, and (i) first column selection control signal $HS_1$ to N-th column selection control signal $HS_N$.

First, during a period from time $t_{10}$ to time $t_{11}$, the reset control signal RE is set to the high level. This closes the discharge switch 42c in each of the N integration circuits 42, so as to discharge the capacitive element 42b.

During a period from time $t_{12}$ after time $t_{11}$ to time $t_{13}$, the vertical shift register 60 sets the row selection control signal $VS_d$ to the high level. This turns the transistors 21 in the carrier capture regions $DB_1$ to $DB_{N+1}$ into connected states, whereby the charges accumulated in the respective photodiodes 22 of the carrier capture regions $DB_1$ to $DB_{N+1}$ are output through the readout lines $R_1$ to $R_N$ to the integration circuits 42 and accumulated in the capacitive elements 42b. Thereafter, during a period from time $t_{14}$ after time $t_{13}$ to time $t_{15}$, the reset control signal RE is set to the high level. This closes the discharge switch 42c in each of the N integration circuits 42, so as to release the charges accumulated in the capacitive element 42b.

Subsequently, during a period from time $t_{16}$ after time $t_{15}$ to time $t_{17}$, the first row selection control signal $VS_1$ is set to the high level. This turns the transistors 21 in the pixels $P_{1,1}$ to $P_{1,N}$ at the first row and the carrier capture region $DA_1$ into connected states. The charges accumulated in the photodiodes 22 of the pixels $P_{1,1}$ to $P_{1,N}$ are output through the readout lines $R_1$ to $R_N$ to the respective integration circuits 42, so as to be accumulated in their capacitive elements 42b. The integration circuits 42 output respective voltage values having magnitudes corresponding to the amounts of charges accumulated in the capacitive elements 42b. On the other hand, the charges accumulated in the photodiode 22 of the carrier capture region $DA_1$ are released to the reference potential line GND through the charge elimination line $R_d$.

Then, during a period from time $t_{18}$ after time $t_{17}$ to time $t_{19}$, the hold control signal Hd is set to the high level, whereby the input switch 44a in each of the N holding circuits 44 is turned into the connected state, whereby the voltage value output from the integration circuit 42 is held by the capacitive element 44c.

Thereafter, during a period from time $t_{20}$ after time $t_{19}$ to time $t_{21}$, the horizontal shift register 61 turns the first column selection control signal $HS_1$ to N-th column selection control signal $HS_N$ into the high levels in sequence. This successively closes the output switches 44b of the N holding circuits 44, whereby the voltage values held by the capacitive elements 44c are sequentially output to the voltage output line 48. During this period, the reset control signal RE is set to the high level, whereby the capacitive element 42b of each integration circuit 42 is discharged.

Next, during a period from time $t_{22}$ after time $t_{21}$ to time $t_{23}$, the vertical shift register 60 sets the second row selection control signal $VS_2$ to the high level. This turns the transistors 21 in the pixels $P_{2,1}$ to $P_{2,N}$ at the second row and the carrier capture region $DA_2$ into connected states. The charges accumulated in the respective photodiodes 22 in the pixels $P_{2,1}$ to $P_{2,N}$ are output through the readout lines $R_1$ to $R_N$ to the integration circuits 42 and accumulated in the capacitive elements 42b. On the other hand, the charges accumulated in the photodiode 22 of the carrier capture region $DA_2$ are released to the reference potential line GND through the charge elimination line $R_d$.

Subsequently, an operation similar to that at the first row successively outputs the voltage values having magnitudes corresponding to the amounts of charges accumulated in the capacitive elements 42b from the N holding circuits 44 to the voltage output line 48. Then, operations similar to that at the first row also convert the charges accumulated in the pixels at the third to M-th rows into voltage values and output them successively to the voltage output line 48. This completes the readout of image data by one image frame from the photodetecting section 20.

Effects exhibited by the solid-state imaging device 1A of this embodiment explained in the foregoing will now be explained. In the solid-state imaging device 1A of this embodiment, light is incident on not only the photodetecting section 20 but its surrounding regions as well. While the solid-state imaging device 1A is used as an X-ray imaging device, even when the regions surrounding the photodetecting section 20 are covered with a scintillator, X-rays transmitted through the scintillator and scintillation light from the scintillator are incident on the regions surrounding the photodetecting section 20. This generates unnecessary charges (unnecessary carriers) in the regions surrounding the photodetecting section 20. Since the vertical shift register 60 juxtaposed with the photodetecting section 20 has a substantial area, a large number of unnecessary carriers occur in the region formed with the vertical shift register 60 in particular.

Figure 6:
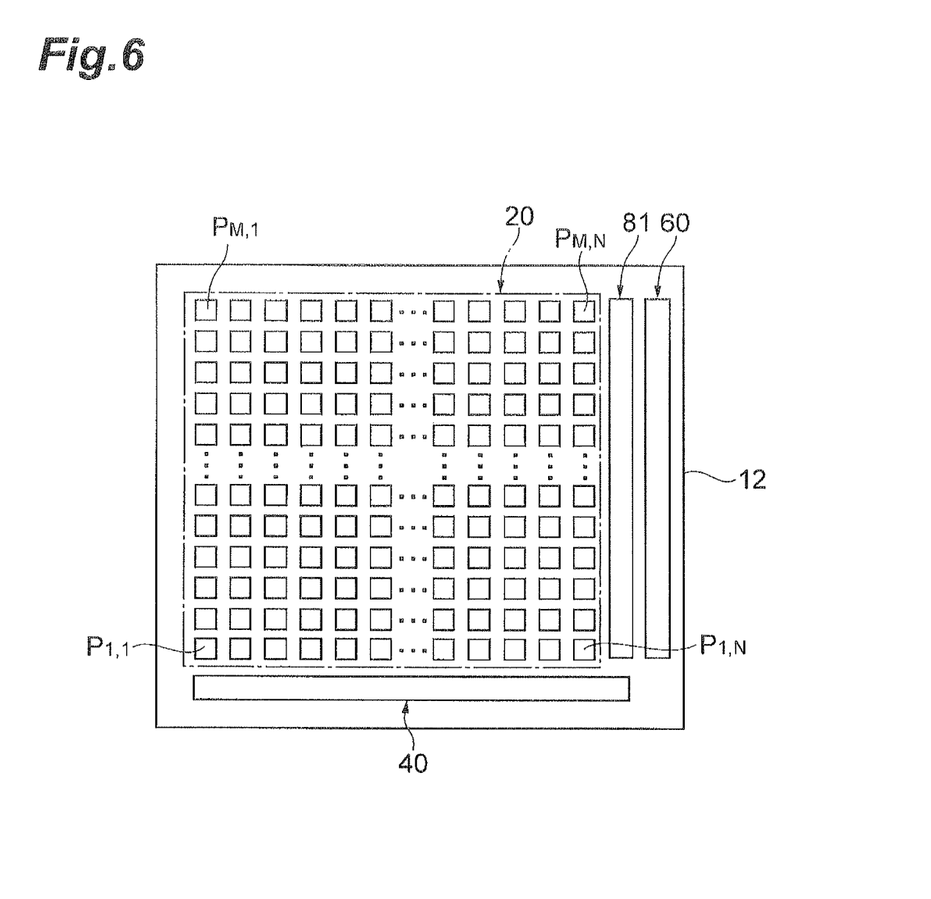
FIG. 6 is a plan view illustrating an example in which a dummy photodiode for absorbing unnecessary carriers is arranged in a region between a shift register and a photodetecting section.

When unnecessary carriers generated in the vertical shift register 60 flow into the photodetecting section 20, noise is superimposed on outputs from pixels $P_{1,N}$ to $P_{M,N}$ adjacent to the vertical shift register 60. FIG. 6 is a plan view illustrating an example in which a photodiode (dummy photodiode) 81 for absorbing unnecessary carriers is arranged in a region between the vertical shift register 60 and photodetecting section 20 in order to avoid the phenomenon described above. The dummy photodiode 81 is formed over a plurality of rows continuously from the first row to M-th row (i.e., continuous in the column direction). Short-circuiting the dummy photodiode 81 to the reference potential line (grounding line) GND can release the unnecessary carriers generated in the vertical shift register 60 to the reference potential line GND, so as to prevent them from flowing into the photodetecting section 20.

However, the following problem exists in this scheme. Typically, between pixels adjacent to each other in the photodetecting section 20, crosstalk exists because of coupling capacitance occurring between their photodiodes 22 and the like. In each pixel, parasitic capacitance also exists between the photodiode 22 and row selection line $Q_m$ connected to each other through the transistor 21 and this parasitic capacitance also affects the crosstalk. However, the above-described dummy photodiode 81 is provided with no transistor and thus does not generate such parasitic capacitance. Therefore, the pixels $P_{1,N}$ to $P_{M,N}$ adjacent to the dummy photodiode 81 have different degrees of crosstalk as compared with the other pixels, whereby output characteristics and magnitudes of noise from the pixels $P_{1,N}$ to $P_{M,N}$ adjacent to the dummy photodiode 81 differ from those of the other pixels.

In view of such problems, the solid-state imaging device 1A of this embodiment arranges the M photodiodes (dummy photodiodes) 22 for the respective rows in the carrier capture regions $DA_1$ to $DA_M$ between the vertical shift register 60 and photodetecting section 20. The unnecessary carriers generated in the vertical shift register 60 are absorbed by these photodiodes 22. This can effectively prevent noise caused by unnecessary carriers generated in the vertical shift register 60 from being superimposed on outputs from pixels in the photodetecting section 20.

In this solid-state imaging device 1A, the photodiodes 22 of the carrier capture regions $DA_1$ to $DA_M$ and the charge elimination line $R_d$ are connected to each other through the transistors 21, and when the transistors 21 are turned on, unnecessary carriers are eliminated from the photodiodes 22 to the reference potential line GND through the charge elimination line $R_d$. Thus, in the solid-state imaging device 1A, the photodiodes 22 of the carrier capture regions $DA_1$ to $DA_M$ are provided with the transistors 21 as in the pixels $P_{1,1}$ to $P_{M,N}$ in the photodetecting section 20. Since the photodiodes 22 are provided for the carrier capture regions $DA_1$ to $DA_M$ of the respective rows, the photodiodes 22 of the carrier capture regions $DA_1$ to $DA_M$ adjacent to each other in the column direction are separated from each other.

Therefore, the solid-state imaging device 1A of this embodiment enables the pixels $P_{1,N}$ to $P_{M,N}$ adjacent to the carrier capture regions $DA_1$ to $DA_M$ to have crosstalk with a magnitude close to that of crosstalk in other pixels, thereby making it possible for the pixels $P_{1,N}$ to $P_{M,N}$ to have output characteristics and magnitudes of noise closer to those of the other pixels. When the carrier capture regions $DA_1$ to $DA_M$ are light-shielded only partly or not at all, light is incident on the photodiodes 22 of the carrier capture regions $DA_1$ to $DA_M$ as in the other pixels $P_{1,1}$ to $P_{M,N}$, so as to generate carriers, whereby they can accumulate carriers by amounts closer to those in the other pixels.

As in this embodiment, the vertical shift register 60 and photodetecting section 20 may be formed on the common substrate 12. While unnecessary carriers generated in the vertical shift register 60 are likely to flow into the photodetecting section 20 in such a case, the solid-state imaging device 1A of this embodiment can effectively prevent the unnecessary carriers from flowing into the photodetecting section 20.

Preferably, as in this embodiment, the control terminals of the transistors 21 of the carrier capture regions $DA_1$ to $DA_M$ are connected to the row selection lines $Q_1$ to $Q_M$ in common with the control terminals of the transistors 21 of the pixels $P_{1,1}$ to $P_{M,N}$. As a consequence, the parasitic capacitance values between the photodiodes 22 of the carrier capture regions $DA_1$ to $DA_M$ and the row selection lines $Q_1$ to $Q_M$ can be made closer to the parasitic capacitance values between the photodiodes 22 of the pixels $P_{1,1}$ to $P_{M,N}$ and the row selection lines $Q_1$ to $Q_M$. Therefore, the magnitude of crosstalk in the pixels $P_{1,N}$ to $P_{M,N}$ adjacent to the carrier capture regions $DA_1$ to $DA_M$ can be made further closer to the magnitude of crosstalk in the other pixels.

An exposure method in a process of manufacturing the solid-state imaging device 1A in accordance with this embodiment will now be explained. When manufacturing the solid-state imaging device 1A, a number of pixels $P_{1,1}$ to $P_{M,N}$ and carrier capture regions $DA_1$ to $DA_M$, $DB_1$ to $DB_{N+1}$ are made by a photolithography technique while using a reticle including a predetermined pattern. At this time, since the pixels $P_{1,1}$ to $P_{M,N}$ have a configuration in common, so-called joint exposure is performed, in which the reticle including the predetermined pattern is exposed to light a plurality of times while moving its position.

Figure 7:
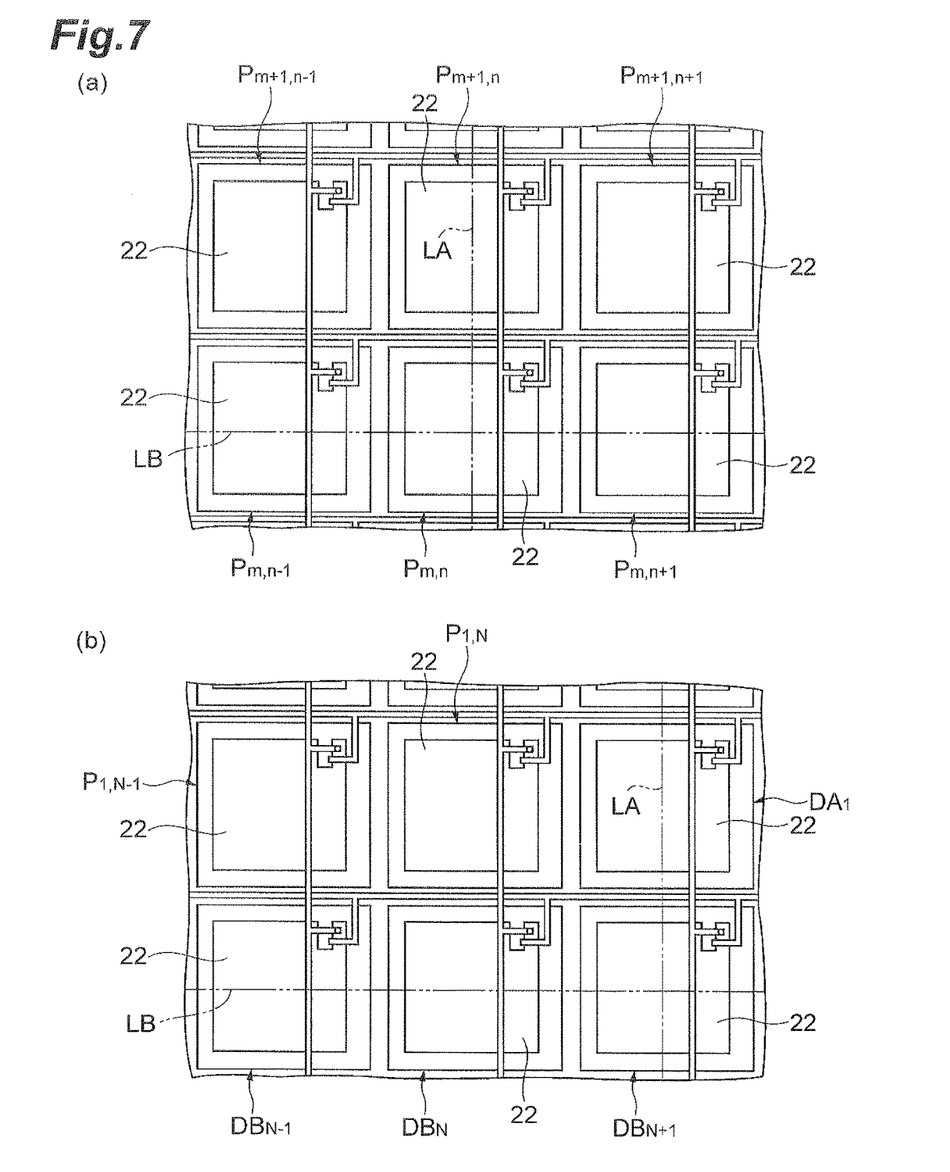

(a) in FIG. 7 is a plan view of the photodetecting section 20 and illustrates an example of boundaries (joints) LA of joint exposure. In the example illustrated in (a) in FIG. 7, lines passing the center of a rectangular photodiode 22 are referred to as boundaries LA, LB. In this case, as illustrated in (b) in FIG. 7, the photodiodes 22 in the carrier capture regions $DA_1$ to $DA_M$, $DB_1$ to $DB_{N+1}$ have a size substantially equivalent to that of the photodiodes 22 in the pixels $P_{1,1}$ to $P_{M,N}$.

Figure 8:
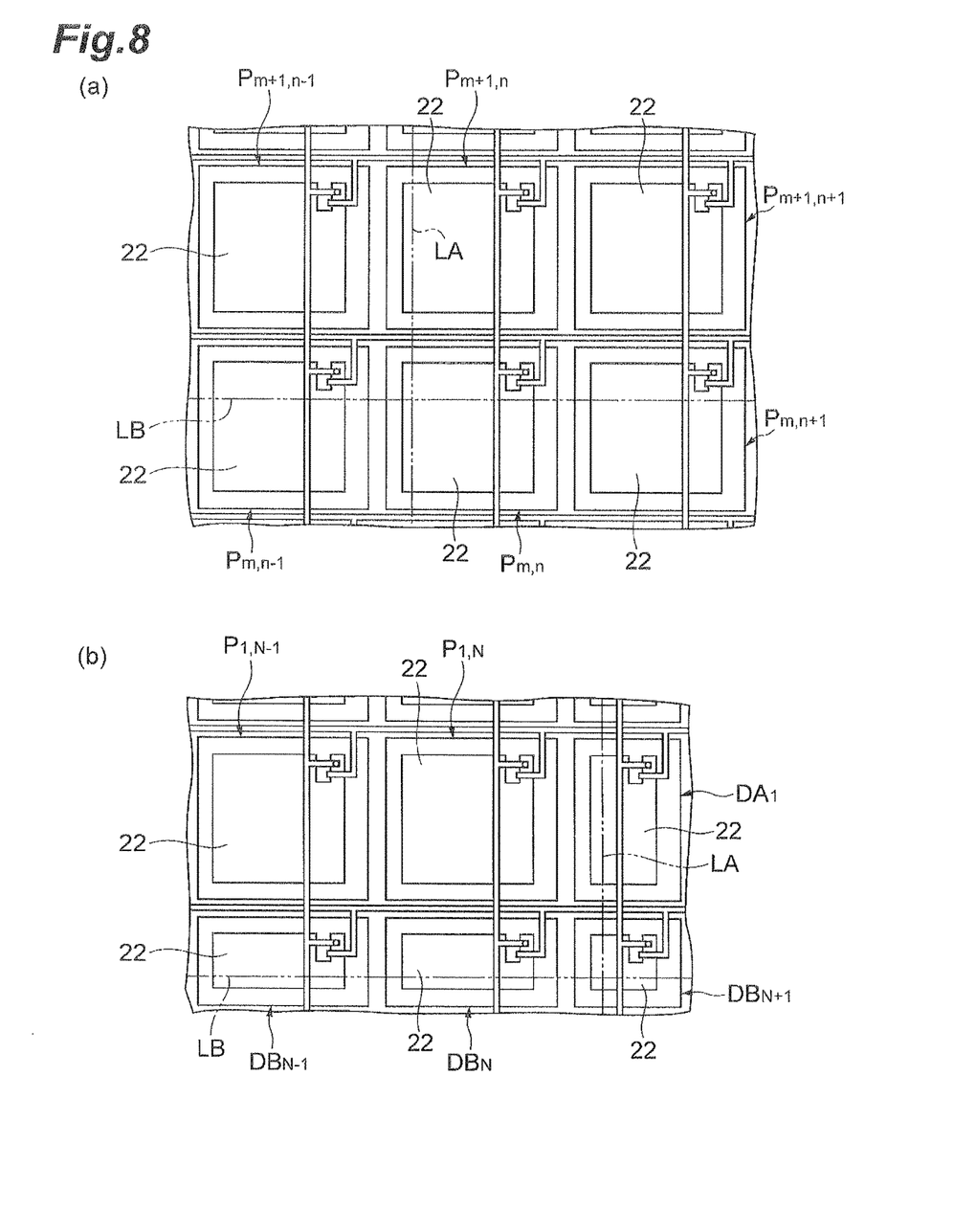

(a) in FIG. 8 is a plan view of the photodetecting section 20 and illustrates another example of boundaries LA of joint exposure. In the example illustrated in (a) in FIG. 8, the boundary LA in the column direction is shifted to the left side (i.e., away from the carrier capture regions $DA_1$ to $DA_M$) from the center of the rectangular photodiode 22, and the boundary LB in the row direction is shifted to the upper side (i.e., away from the carrier capture regions $DB_1$ to $DB_N$) from the center of the rectangular photodiode 22. In this case, as illustrated in (b) in FIG. 8, the size of the photodiodes 22 in the carrier capture regions $DA_1$ to $DA_M$, $DB_1$ to $DB_{N+1}$ can be made smaller than the size of the photodiodes 22 in the pixels $P_{1,1}$ to $P_{M,N}$.

Specifically, the width of the photodiodes 22 of the carrier capture regions $DA_1$ to $DA_M$ in the row direction can be made shorter than the width of the photodiodes 22 of the pixels $P_{1,1}$ to $P_{M,N}$ in this direction. The width of the photodiodes 22 of the carrier capture regions $DB_1$ to $DB_N$ in the column direction can also be made shorter than the width of the photodiodes 22 of the pixels $P_{1,1}$ to $P_{M,N}$ in this direction. Therefore, the region required for surrounding the photodetecting section 20 can be made narrower.

Figure 9:
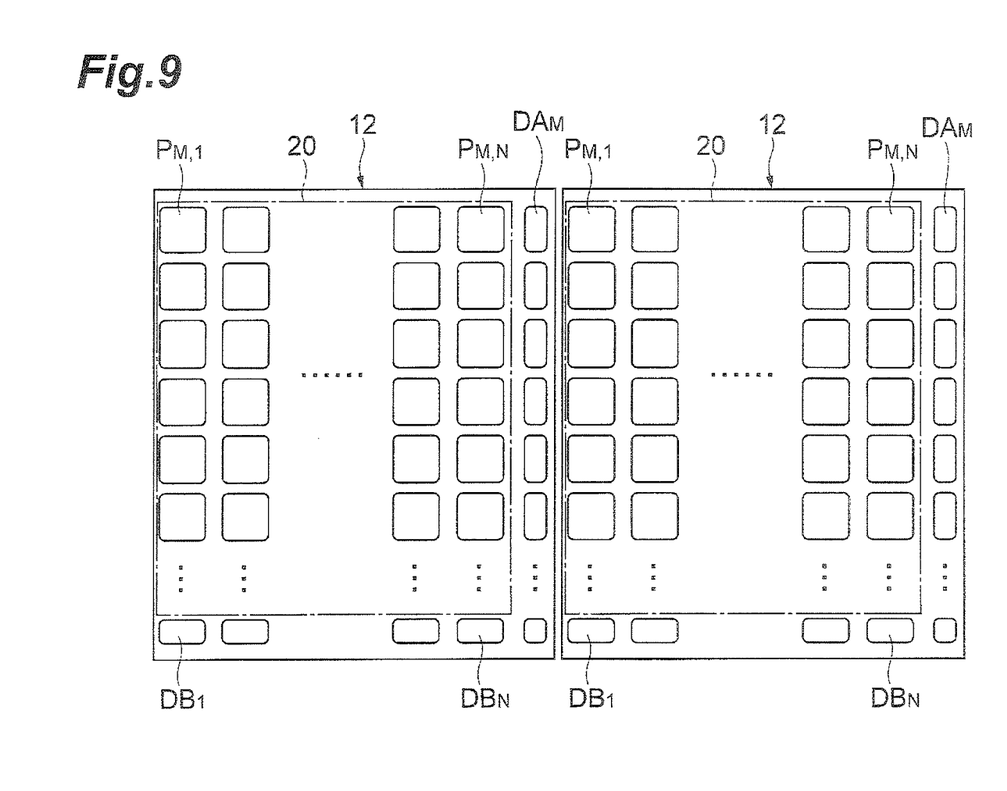
FIG. 9 is a plan view schematically illustrating an example in which two glass substrates are juxtaposed with each other.

The following advantages are obtained by making the photodiodes 22 of the carrier capture regions $DA_1$ to $DA_M$, $DB_1$ to $DB_{N+1}$ smaller as described above. FIG. 9 is a plan view schematically illustrating an example in which two glass substrates 12 are juxtaposed with each other. Formed on the glass substrates 12 are the pixels $P_{1,1}$ to $P_{M,N}$ of the photodetecting section 20 and the carrier capture regions $DA_1$ to $DA_M$, $DB_1$ to $DB_{N+1}$. Thus juxtaposing a plurality of glass substrates 12 with each other is effective in further increasing the area of the photodetecting section in the solid-state imaging device as a whole.

At this time, arranging the pixels $P_{1,1}$ to $P_{M,N}$ and carrier capture regions $DA_1$ to $DA_M$ and $DB_1$ to $DB_N$ identically on the two glass substrates 12 enables parts to be used in common, thereby suppressing the manufacturing cost. In this case, however, the carrier capture regions $DA_1$ to $DA_M$ are located between the two photodetecting sections 20, thus yielding an insensitive region (dead area) in which the image is not obtained. In such a case, the above-described insensitive region can be narrowed by making the width of the photodiodes 22 of the carrier capture regions $DA_1$ to $DA_M$ in the row direction smaller than the width of the photodiodes 22 in the pixels $P_{1,1}$ to $P_{M,N}$ in this direction.

Referring to (a) in FIG. 8, in a normal pixel $P_{m+1,n}$, a transistor is formed on the side closer to $P_{m+1,n+1}$. The joint (boundary LA) of the pixel $P_{m+1,n}$ is located on the side closer to the pixel $P_{m+1,n-1}$. That is, with respect to the center of the pixel $P_{m+1,n}$, the transistor and joint (boundary LA) exist on one side and the other side of the pixel, respectively, thereby increasing the distance between the joint and transistor in the row direction. Thus, the joint and transistor can physically be separated from each other, whereby manufacturing defects can be reduced.

The solid-state imaging device in accordance with the present invention is not limited to the above-described embodiment, but can be modified in various ways. For example, the photodetecting section illustrated in the above-described embodiment may comprise a configuration in which a film of amorphous silicon or polycrystalline silicon is formed on a glass substrate. In this case, the transistor 21 is favorably realized by a thin-film transistor. The photodetecting section may also be produced on a monocrystalline silicon substrate.

Though the above-described embodiment employs the present invention in a so-called passive pixel sensor (PPS) in which each pixel has no amplifier circuit while integration circuits are provided for respective readout lines of columns, the present invention is also applicable to a so-called active pixel sensor (APS) in which each pixel has an amplifier circuit.

While the above-described embodiment illustrates an example in which the carrier capture regions $DB_1$ to $DB_{N+1}$ are juxtaposed with the photodetecting section in the column direction, the carrier capture regions $DB_1$ to $DB_{N+1}$ may be omitted.

The solid-state imaging device in accordance with the above-described embodiment uses a configuration comprising a photodetecting section having M×N pixels (each of M and N being an integer of 2 or more), each including a first photodiode and a first switch circuit having one terminal connected to the first photodiode, two-dimensionally arrayed in M rows and N columns; N readout lines provided for the respective columns and connected to the other terminals of the first switch circuits included in the pixels of the corresponding columns; N integration circuits for outputting respective voltage values corresponding to amounts of charges input through the N readout lines; a shift register, juxtaposed with the photodetecting section in a row direction, for controlling an open/closed state of the first switch circuits for each row; M dummy photodiodes arranged in a region between the shift register and the photodetecting section for the respective rows; M second switch circuits having respective one terminals connected to the M dummy photodiodes; and a charge discharge line connected to the other terminals of the M second switch circuits and short-circuited to a reference potential line.

The solid-state imaging device may have a configuration in which the dummy photodiode has a width in the row direction shorter than that of the first photodiode in the row direction. In the above solid-state imaging device, the size of the dummy photodiode is not always required to be equal to that of the first photodiode. Therefore, thus making the width of the dummy photodiode shorter than that of the first photodiode can narrow regions surrounding the photodetecting section, whereby an insensitive region occurring between solid-state imaging devices when a plurality of solid-state imaging devices are juxtaposed with each other, for example, can be made narrower.

The solid-state imaging device may also have a configuration in which the shift register and the photodetecting section are formed on a common substrate. While unnecessary carriers generated in the shift register are likely to flow into the photodetecting section in such a case, the above-described solid-state imaging device can effectively prevent the unnecessary carriers from flowing into the photodetecting section.

The solid-state imaging device may have a configuration further comprising M row selection lines, provided for the respective rows, for electrically connecting control terminals of the first and second switch circuits for controlling the open/closed state and the shift register to each other. Thus providing the row selection lines in common for the first and second switch circuits enables pixels adjacent to the dummy photodiode to have crosstalk with a magnitude further closer to that of crosstalk in the other pixels.

INDUSTRIAL APPLICABILITY

The present invention can be utilized as a solid-state imaging device which enables pixels adjacent to a dummy photodiode to have output characteristics and magnitudes of noise closer to those of the other pixels.

REFERENCE SIGNS LIST

1A—solid-state imaging device, 12—substrate, 20—photodetecting section, 21—transistor, 22—photodiode, 30—unnecessary carrier capture section, 40—readout circuit section, 42—integration circuit, 44—holding circuit, 45—hold line, 46—reset line, 48—voltage output line, 60—vertical shift register, 61—horizontal shift register, $DA_1$ to $DA_M$, $DB_1$ to $DB_{N+1}$—carrier capture region, GND—reference potential line, LA, LB—boundary (joint), $P_{1,1}$ to $P_{M,N}$—pixel, $Q_1$ to $Q_M$, $Q_d$—row selection line, $R_1$ to $R_N$—readout line, $R_d$—charge elimination line.

The invention claimed is:

1. A solid-state imaging device comprising:
a photodetecting section having M×N pixels (each of M and N being an integer of 2 or more), each including a first photodiode and a first switch circuit having one terminal connected to the first photodiode, two-dimensionally arrayed in M rows and N columns;
N readout lines provided for the respective columns and connected to the other terminals of the first switch circuits included in the pixels of the corresponding columns;
a readout circuit section connected to the N readout lines;
a shift register, juxtaposed with the photodetecting section in a row direction, for controlling an open/closed state of the first switch circuits for each row;
M dummy photodiodes arranged in a region between the shift register and the photodetecting section for the respective rows;
M second switch circuits having respective one terminals connected to the M dummy photodiodes; and
a charge elimination line connected to the other terminals of the M second switch circuits and short-circuited to a reference potential line, wherein
the dummy photodiode has a width in the row direction shorter than that of the first photodiode in the row direction.

2. The solid-state imaging device according to claim 1, wherein the shift register and the photodetecting section are formed on a common substrate.

3. The solid-state imaging device according to claim 1, further comprising M row selection lines, provided for the respective rows, for electrically connecting control terminals of the first and second switch circuits for controlling the open/closed state and the shift register to each other.

4. The solid-state imaging device according to claim 1, wherein the readout line is disposed on the first photodiode of the pixel.

5. The solid-state imaging device according to claim 1, wherein the charge elimination line is disposed on the dummy photodiode.

6. The solid-state imaging device according to claim 1, wherein the readout line is disposed on the first photodiode of the pixel, and the charge elimination line is disposed on the dummy photodiode.

7. The solid-state imaging device according to claim 1, wherein a line passing through a region of the dummy photodiode is set as a boundary of joint exposure.

8. A solid-state imaging device comprising:
a photodetecting section having M×N pixels (each of M and N being an integer of 2 or more), each including a first photodiode and a first switch circuit having one terminal connected to the first photodiode, two-dimensionally arrayed in M rows and N columns;
N readout lines provided for the respective columns and connected to the other terminals of the first switch circuits included in the pixels of the corresponding columns;
a readout circuit section connected to the N readout lines;
a shift register, juxtaposed with the photodetecting section in a row direction, for controlling an open/closed state of the first switch circuits for each row;
a plurality of dummy photodiodes arranged in a region between the shift register and the photodetecting section;
a plurality of second switch circuits having respective one terminals connected to the plurality of dummy photodiodes; and
a charge elimination line connected to the other terminals of the plurality of second switch circuits and short-circuited to a reference potential line, wherein
the dummy photodiode has a width in the row direction shorter than that of the first photodiode in the row direction.

9. The solid-state imaging device according to claim 8, wherein the shift register and the photodetecting section are formed on a common substrate.

10. The solid-stating imaging device according to claim 8, further comprising a plurality of row selection lines, provided for the respective rows, for electrically connecting control terminals of the first and second switch circuits for controlling the open/closed state and the shift register to each other.

11. The solid-state imaging device according to claim 8, wherein the readout line is disposed on the first photodiode of the pixel.

12. The solid-state imaging device according to claim 8, wherein the charge elimination line is disposed on the dummy photodiode.

13. The solid-state imaging device according to claim 8, wherein the readout line is disposed on the first photodiode of the pixel, and the charge elimination line is disposed on the dummy photodiode.

14. The solid-state imaging device according to claim 8, wherein a line passing through a region of the dummy photodiode is set as a boundary of joint exposure.

* * * * *